(12) United States Patent
Furukawa et al.

(10) Patent No.: US 8,969,960 B2
(45) Date of Patent: Mar. 3, 2015

(54) POWER SEMICONDUCTOR DEVICE

(75) Inventors: Akihiko Furukawa, Tokyo (JP); Yasuhiro Kagawa, Tokyo (JP); Naruhisa Miura, Tokyo (JP); Masayuki Imaizumi, Tokyo (JP); Kazuyasu Nishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/346,466

(22) PCT Filed: Jun. 7, 2012

(86) PCT No.: PCT/JP2012/064630
§ 371 (c)(1),
(2), (4) Date: Mar. 21, 2014

(87) PCT Pub. No.: WO2013/042406
PCT Pub. Date: Mar. 28, 2013

(65) Prior Publication Data
US 2014/0225114 A1    Aug. 14, 2014

(30) Foreign Application Priority Data

Sep. 21, 2011 (JP) ................................. 2011-205766

(51) Int. Cl.
*H01L 29/76* (2006.01)
*H01L 29/94* (2006.01)
(Continued)

(52) U.S. Cl.
CPC .......... *H01L 23/60* (2013.01); *H01L 29/66068* (2013.01); *H01L 29/7803* (2013.01);
(Continued)

(58) Field of Classification Search
CPC ................ H01L 29/66068; H01L 29/7803; H01L 29/7804; H01L 29/7811; H01L 29/7815; H01L 23/60; H01L 27/0296; H01L 29/0696; H01L 29/1608

USPC .................. 257/287, 327–329, 341–343, 401
See application file for complete search history.

(56) References Cited

U.S. PATENT DOCUMENTS 5,973,367 A * 10/1999 Williams ...................... 257/365
6,936,866 B2    8/2005 Deboy et al.
(Continued)

FOREIGN PATENT DOCUMENTS

JP    2000 323707    11/2000
JP    2002 542629    12/2002
(Continued)

OTHER PUBLICATIONS

International Preliminary Report on Patentability and Written Opinion issued Apr. 3, 2014 in PCT/JP2012/064630 (with English language translation).

(Continued)

*Primary Examiner* — Hung Vu
(74) *Attorney, Agent, or Firm* — Oblon, McClelland, Maier & Neustadt, L.L.P.

(57) ABSTRACT

A power semiconductor device includes a second conductive type sense outer-peripheral well formed to surround a plurality of sense wells on the surface of a drift layer, a first conductive type main-cell source region selectively formed on the surface of the main cell well, a first conductive type sense source region selectively formed on the surface of the sense well, a first conductive type capacitor lower electrode region selectively formed on the surface of the sense outer-peripheral well, a gate insulation film formed on the channel regions and on the sense outer-peripheral well, a gate electrode formed on the gate insulation film, and a sense pad electrically connected to the sense well and the sense source region as well as on the sense outer-peripheral well and the capacitor lower electrode region.

4 Claims, 13 Drawing Sheets

(51) Int. Cl.
  *H01L 23/60* (2006.01)
  *H01L 29/66* (2006.01)
  *H01L 29/78* (2006.01)
  *H01L 27/02* (2006.01)
  *H01L 29/06* (2006.01)
  *H01L 29/16* (2006.01)

(52) U.S. Cl.
  CPC ........ *H01L29/7804* (2013.01); *H01L 29/7811* (2013.01); *H01L 29/7815* (2013.01); *H01L 27/0296* (2013.01); *H01L 29/0696* (2013.01); *H01L 29/1608* (2013.01); *H01L 2924/0002* (2013.01)
  USPC ........... 257/341; 257/329; 257/342; 257/343; 257/401

(56) References Cited

U.S. PATENT DOCUMENTS 7,358,555 B2    4/2008  Iwamatsu et al.
8,350,322 B2 *  1/2013  Matsuoka ..................... 257/330
8,507,986 B2 *  8/2013  Arthur et al. .................. 257/341

FOREIGN PATENT DOCUMENTS

| JP | 2003 243656 | 8/2003 |
| JP | 2005 150762 | 6/2005 |
| JP | 2006 303377 | 11/2006 |
| JP | 2008 41948 | 2/2008 |
| JP | 2010 263032 | 11/2010 |

OTHER PUBLICATIONS

International Search Report Issued Jul. 17, 2012 in PCT/JP12/064630 Filed Jun. 7, 2012.

Japanese Office Action Issued Jan. 21, 2014 in Japanese Application No. 2013-534611 (with English translation).

* cited by examiner

F I G. 1
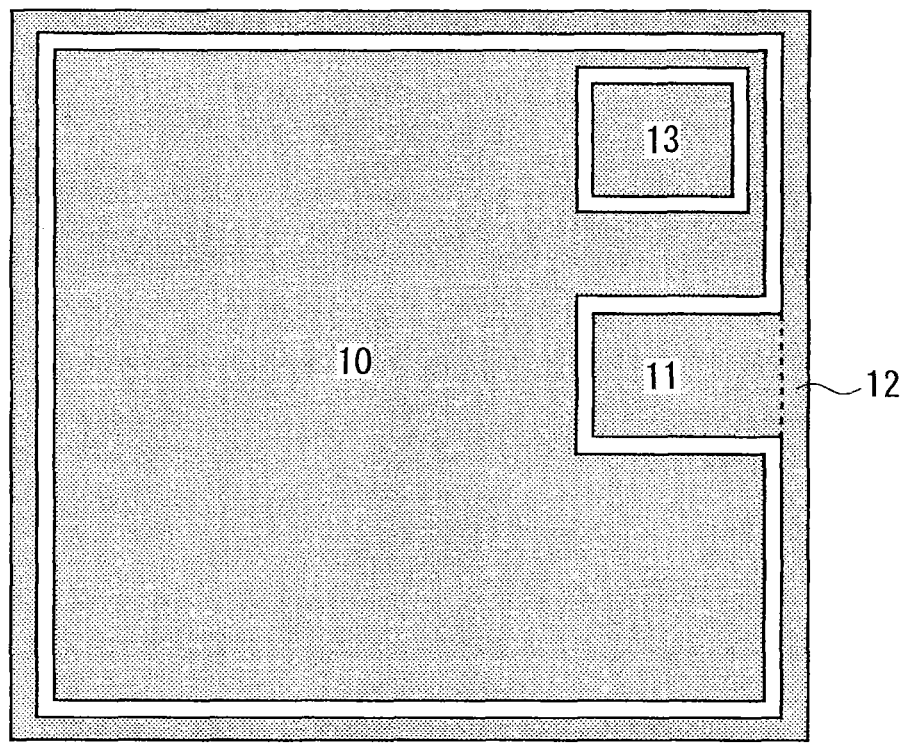

POWER SEMICONDUCTOR DEVICE

TECHNICAL FIELD

The present invention relates to a power semiconductor device, and particularly relates to a countermeasure against static electricity of a current detection element of the power semiconductor device.

BACKGROUND ART

In a power semiconductor device, current detection elements (sense cells) are provided for the purpose of protecting main cells by detecting excess current, in addition to main elements (main cells) for driving a load in some cases. The sense cells are provided together with the main cells on the same substrate, and when the sense cells detect excess current, the sense cells and the main cells are interrupted, so that these cells can be protected.

Since a smaller number of the sense cells are arranged than that of the main cells in order to avoid reduction in electric efficiency, transistor capacitance is small and a gate insulation film is easily destroyed by a surge voltage of static electricity and the like.

Then, in Patent Document 1, there is provided a structure of a sense cell in which transistor capacitance is made large, by forming a conductive type (p-type) barrier layer different from a semiconductor substrate, and by connecting a barrier layer to a sense terminal, on a semiconductor substrate surface between the sense cell and the main cell, in a MOSFET incorporating the sense cell. Specifically, a detection source electrode connected to a source terminal of the sense cell of the MOSFET is formed in a large area to connect a bonding wire. A large capacitance parasitic capacitor is formed by a thin gate insulation film sandwiched between a large-area gate electrode arranged under a detection source electrode and a p-type barrier layer. With this structure, since a large-capacitance parasitic capacitor is formed between the gate electrode and the detection source electrode, surge resistance to static electricity and the like can be enhanced.

PRIOR ART DOCUMENT

Patent Document

Patent Document 1: Japanese Patent Application Laid-Open No. 2003-243656

SUMMARY OF INVENTION

Problems to be Solved by the Invention

However, the power semiconductor device is required to have not only surge resistance at a handling time and the like but also high resistance against a high voltage and large current at a switching operation time as a basic operation.

Specifically, at the time of switching the MOSFET from an ON state to an OFF state, a drain voltage of the MOSFET rapidly increases, and reaches several hundred voltages depending on the case. In the OFF state due to the increase in the drain voltage, displacement current is generated at a drain electrode side and at a source electrode side, via a cavity-layer capacitor formed between a p-type barrier layer and an n-type drain layer (semiconductor substrate). The displacement current generated in this way flows to a source electrode via the p-type barrier layer. Since an area of the p-type barrier layer arranged under the gate electrode is very large, when displacement current flows in the p-type barrier layer, a voltage having a value that cannot be ignored is generated in the barrier layer, due to resistances of the barrier layer and contact holes. As a result, there is a risk that a gate insulation film is destroyed by a large potential difference between the barrier layer and the gate electrode.

In the light of the above problems, an object of the present invention is to provide a power semiconductor device that can perform a stable switching operation and also has high resistance against surge.

Means for Solving the Problems

A power semiconductor device of the present invention includes a first conductive type semiconductor substrate, a first conductive type drift layer formed on a first principal surface of the semiconductor substrate, a plurality of second conductive type main cell wells and a plurality of second conductive type sense wells selectively formed on a surface of the drift layer, a second conductive type sense outer-peripheral well formed to surround the plurality of sense wells on the surface of the drift layer, a first conductive type main-cell source region selectively formed on a surface of a main cell well, a first channel region formed on the main-cell well surface between the main-cell source region and the drift layer, a first conductive type sense source region selectively formed on the surface of the sense well, a second channel region formed on the surface of the sense well between the sense source region and the drift layer, a first conductive type capacitor lower electrode region selectively formed on the surface of the sense outer-peripheral well, a gate insulation film formed on the first and second channel regions and on the sense outer-peripheral well, a gate electrode formed on the gate insulation film, a source pad electrically connected to main cell well and the main-cell source region, a sense pad electrically connected to the sense well, the sense source region, and the sense outer-peripheral well and the capacitor lower electrode region, and a drain electrode formed on a second principal surface of the semiconductor substrate.

Effects of the Invention

The power semiconductor device of the present invention includes a second conductive type sense outer-peripheral well formed to surround the plurality of sense wells, a first conductive type main-cell source region selectively formed on a surface of a main cell well, a first channel region formed on the surface of the main-cell well between the main-cell source region and the drift layer, a first conductive type sense source region selectively formed on the surface of the sense well, a second channel region formed on the surface of the sense well between the sense source region and the drift layer, a first conductive type capacitor lower electrode region selectively formed on the surface of the sense outer-peripheral well, a gate insulation film formed on the first and second channel regions and on the sense outer-peripheral well, a gate electrode formed on the gate insulation film, a sense pad electrically connected to the sense well, the sense source region, and the sense outer-peripheral well and the capacitor lower electrode region, and a drain electrode formed on a second principal surface of the semiconductor substrate. The sense outer-peripheral well, the capacitor lower electrode region, the gate insulation film, and the gate electrode operate as a capacitor. Therefore, by increasing capacitance of the capacitor by adjusting the number of cells, the electric field in a gate insulation film when static electricity is applied can be mitigated, and dielectric breakdown can be suppressed.

The object, features, aspects, and advantages of the present invention become more apparent, based on the following detailed description and attached drawings.

BRIEF DESCRIPTION OF DRAWINGS

FIG. 1 is a plan view of a power semiconductor device according to a first embodiment.

DESCRIPTION OF EMBODIMENTS (First Embodiment)
<Configuration>

In a first embodiment, a vertical-type n-channel silicon carbide MOSFET is described as an example of a power semiconductor device that incorporates current detection elements (current sensors). Although conductive types of a semiconductor are described, by calling a first conductive type as an n-type and calling a second conductive type as a p-type, the opposite may be acceptable.

FIG. 1 is a plan view when a silicon carbide MOSFET chip as the power semiconductor device according to the first embodiment is schematically seen from an upper surface. In FIG. 1, at a chip center part, a source pad 10 is formed, and at an outer peripheral part, a gate wiring 12 is formed. The gate wiring 12 is extended from the gate pad 11. Further, at a part of an inside of the source pad 10, a sense pad 13 is formed.

The source pad 10 is electrically connected to a source region of a MOSFET of a main cell that is provided in a plurality of number at lower parts of the source pad 10. The sense pad 13 is electrically connected to a source region of a MOSFET of a sense cell that is provided in a plurality of number at lower parts of the sense pad 13. Further, the gate pad 11 and the gate wiring 12 are electrically connected to a gate electrode of MOSFETs of a main cell and a sense cell, and apply a gate voltage supplied from an outside control circuit (not shown) to a gate electrode.

Figure 2:
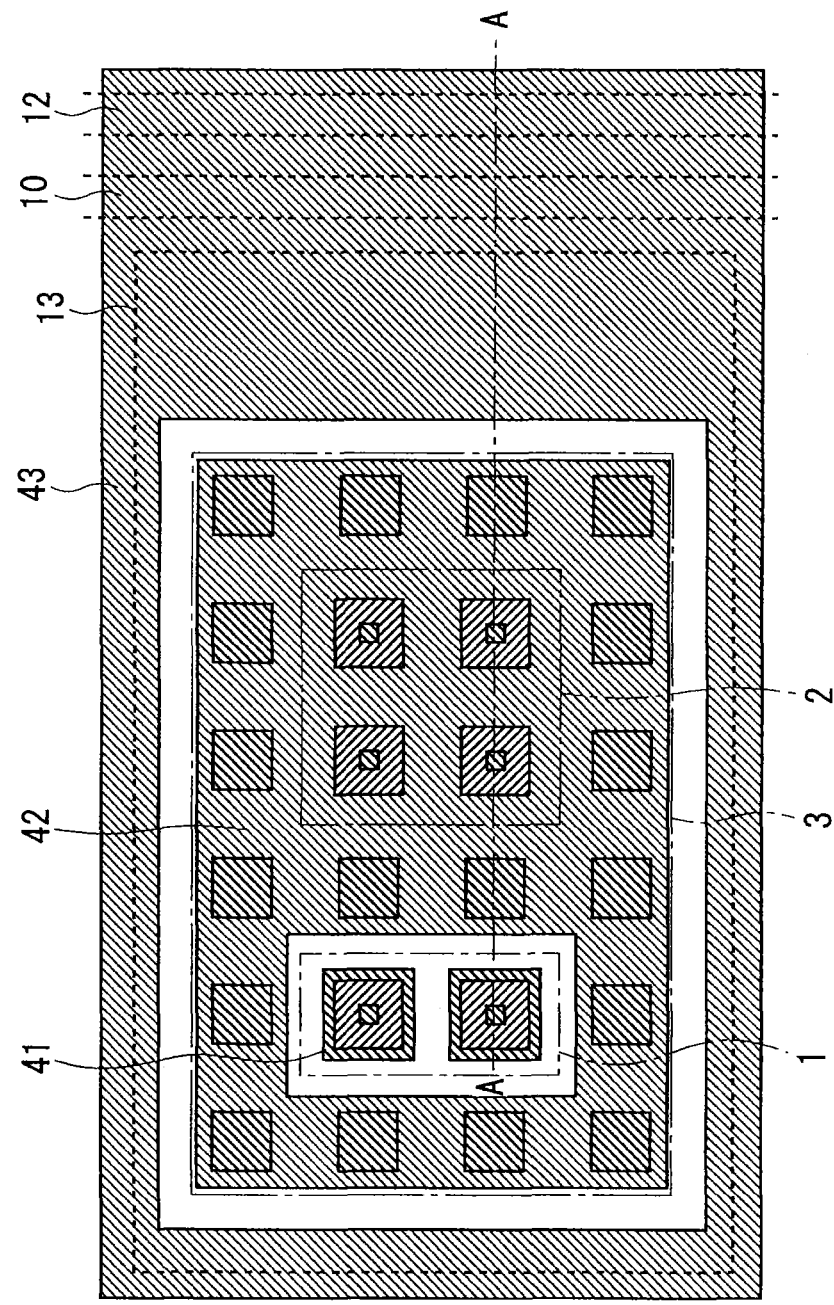
FIG. 2 is a plan view of the power semiconductor device according to the first embodiment.

FIG. 2 is a perspective plan view of a lower layer of the sense pad 13 shown in FIG. 1 seen from an upper part. In FIG. 2, an interlayer insulation film and a gate electrode of polysilicon at a lower part of the sense pad 13 shown in FIG. 1 are not shown.

A sense outer-peripheral well 42 is formed to surround, in a planar view, a sense well 41 that configures a MOSFET1 of a sense cell. Further, a sense pad well 43 is formed to surround, in a planar view, the sense outer-peripheral well 42. The source pad 10 and the gate wiring 12 are formed to include a part of the sense pad well 43.

The sense outer-peripheral well 42 configures a pn diode 3, and further, a part of a region in the pn diode 3 configure a capacitor 2.

Figure 3:
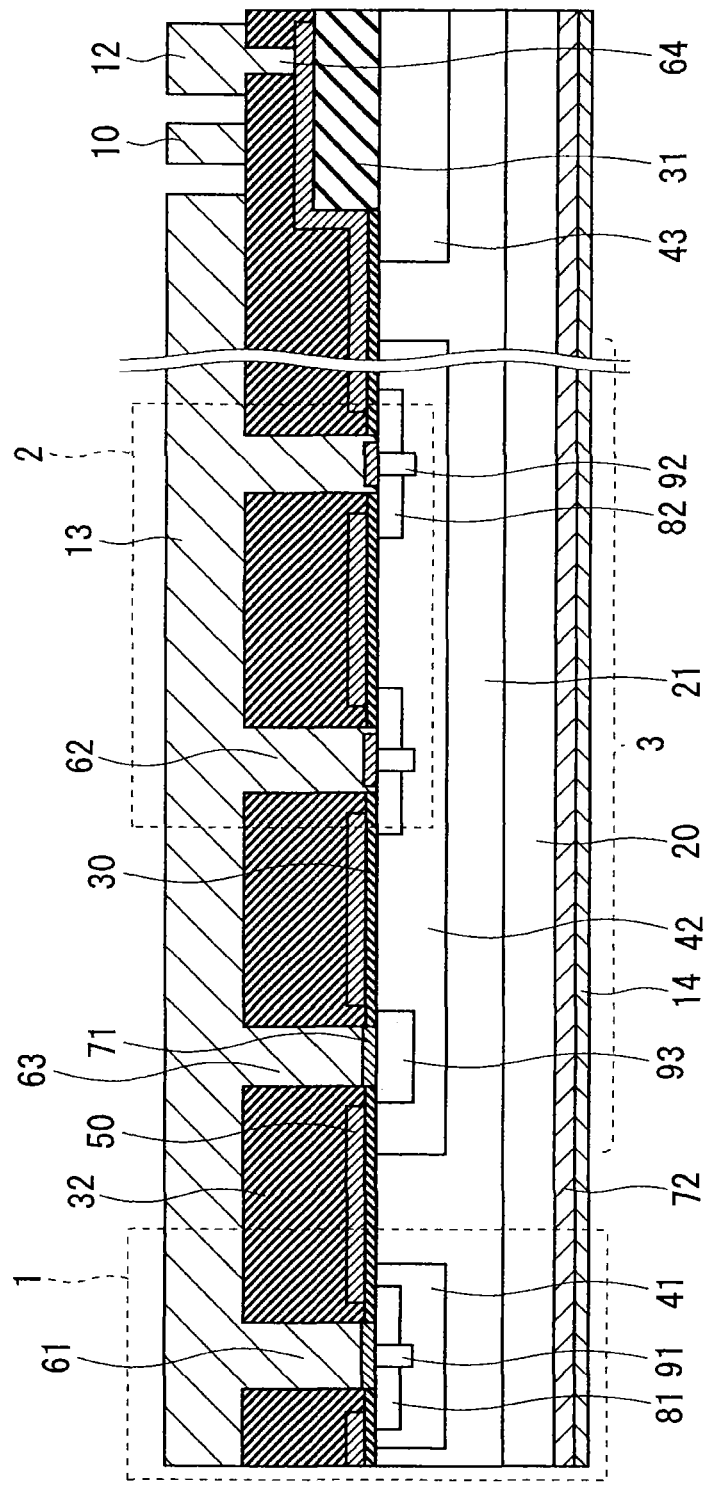
FIG. 3 is a cross-sectional view of the power semiconductor device according to the first embodiment.

FIG. 3 is a cross-sectional view along A-A of FIG. 2. As shown in FIG. 3, in the power semiconductor device according to the first embodiment, a drift layer 21 configured by n-type silicon carbide is formed on a surface of a semiconductor substrate 20 configured by n-type low-resistance silicon carbide. On a surface of a drift layer 21 below the sense pad 13, a plurality of sense well 41 configured by p-type silicon carbide are selectively formed (only one is shown in FIG. 3). On the surface of the drift layer 21 with a predetermined interval in a cross-sectional lateral direction from the sense well 41, a sense outer-peripheral well 42 configured by p-type silicon carbide is formed. On the surface of the drift layer 21 with a predetermined interval in a cross-sectional lateral direction (opposite direction to the sense well 41) from the sense outer-peripheral well 42, a sense pad well 43 of p-type silicon carbide is formed.

On the surface of the sense well 41, an n-type sense source region 81 is selectively formed. Inside the sense source region 81, a low-resistance p-type contact region 91 protruding from the surface of the sense source region 81 to the sense well 41 is formed. On the surface of the sense well 41 between the sense source region 81 and the drift layer 21, a second channel region is formed.

On the surface of the sense outer-peripheral well 42, a plurality of n n-type capacitor lower electrode regions 82 are selectively formed. Inside each of the capacitor lower electrode regions 82, there is formed a p-type contact region 92 which protrudes from the surface of the capacitor lower electrode region 82 to the sense outer-peripheral well 42 and have a lower resistance than the sense outer-peripheral well 42.

As also shown in FIG. 2, on the surface of a peripheral part of the sense outer-peripheral well 42, the capacitor lower electrode region 82 is not formed, but a p-type contact region 93 with a lower resistance than that of the sense outer-peripheral well 42 is selectively formed. Further, on the surface of a region near the sense well 41 out of the sense outer-peripheral well 42, the capacitor lower electrode region 82 is not formed, but the p-type contact region 93 with a lower resistance than that of the sense outer-peripheral well 42 is selectively formed.

A gate insulation film 30 is formed at an upper part of a channel region (second channel region) of the sense well 41 and the sense outer-peripheral well 42. Further, a field insulation film 31 thicker than the gate insulation film 30 is formed at an upper part of the sense pad well 43. At an upper part of the gate insulation film 30 and the field insulation film 31, a gate electrode 50 is partly formed. An interlayer insulation film 32 is formed on the gate insulation film 30, the field insulation film 31, and the gate electrode 50.

On the contact region 91 and a part of the sense source region 81, the gate insulation film 30 and the interlayer insulation film 32 are removed, and a sense contact hole 61 is formed. Similarly, on the contact region 92 and a part of the capacitor lower electrode region 82, a capacitor contact hole 62 is formed. On the contact region 93, an outer-peripheral well contact hole 63 is formed.

The sense pad 13 is formed so that the contact region 91 and the sense source region 81 are connected via the sense contact hole 61. The sense pad 13 is connected to the contact region 92 and the capacitor lower electrode region 82 via the capacitor contact hole 62, and is connected to the contact region 93 via the outer-peripheral well contact hole 63.

Further, on each bottom of the contact holes 61, 62, and 63, an ohmic electrode 71 is formed to reduce resistance between the sense well 41 and the sense pad 13 or between the sense outer-peripheral well 42 and the sense pad 13.

At a rear surface side of the semiconductor substrate 20, a drain electrode 14 is formed via a rear-surface ohmic electrode 72.

A part of the interlayer insulation film 32 on the gate electrode 50 on the field insulation film 31 is removed, and a gate contact hole 64 is formed. The gate wiring 12 (gate pad 11) is connected to the gate electrode 50 via the gate contact hole 64.

In the power semiconductor device according to the first embodiment, a region that includes the sense well 41 configures the MOSFET1. Further, the sense outer-peripheral well 42, the capacitor lower electrode region 82, the gate insulation film 30, and the gate electrode 50 operate as a capacitor 2 between the gate electrode 50 and the sense pad 13. A pn junction between a p-type sense outer-peripheral well and an n-type drift layer 21 operates as a pn junction diode 3 between the drain electrode 14 and the sense pad 13.

<Manufacturing Method>

Next, a method of manufacturing a power semiconductor device according to the first embodiment is described with reference to FIG. 4 to FIG. 8. FIG. 4 to FIG. 8 are cross-sectional views each schematically showing a part of a power semiconductor device in a manufacturing process of the power semiconductor device according to the first embodiment.

First, the drift layer 21 of n-type silicon carbide is epitaxially grown by using a Chemical Vapor Deposition (CVD) method, on the surface of the semiconductor substrate 20 of the low-resistance n-type silicon carbide. An impurity concentration is set to $1\times10^{13}$ cm$^{-3}$ to $1\times10^{18}$ cm$^{-3}$, and a thickness is set to 4 μm to 200 μm. For the semiconductor substrate 20, there is used a semiconductor substrate of which a plane orientation of a first principal surface is (0001) plane of 4H polytype and is inclined to a c-axis direction by eight degrees or below, for example. Other plane orientation, polytype, or inclination angle may be acceptable, or there may be without inclination.

Next, at predetermined positions of the surface of the drift layer 21, a plurality of p-type main cell wells (not shown) that configure main cells, a plurality of p-type sense wells 41, and a p-type sense pad well 43 are formed by an ion injection method. The sense outer-peripheral well 42 is not formed at this stage. By connecting in a later process a plurality of sense wells 41 surrounding a specific sense well 41, the sense outer-peripheral well 42 is formed. As a p-type impurity to be ion-injected, Al (aluminum) or B (boron) is preferable. An injection depth is set not deeper than a bottom surface of the drift layer 21 as an epitaxial crystal-growth layer, and is a value of a range of 0.3 μm to 2 μm, for example. Further, their p-type impurity concentrations are set higher than an impurity concentration of the drift layer 21, and also within a range of $1\times10^{15}$ cm$^{-3}$ to $1\times10^{19}$ cm$^{-3}$.

Figure 4:
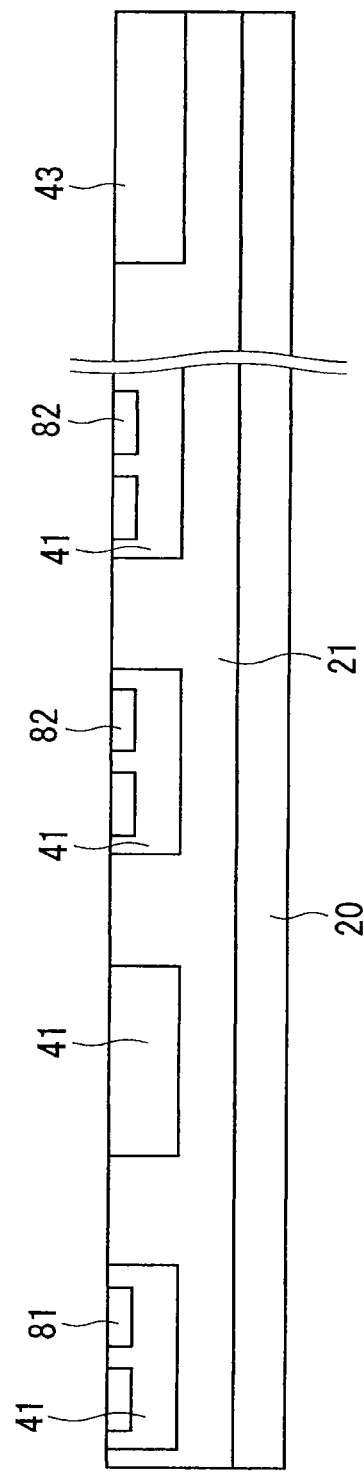
FIG. 4 is a cross-sectional view showing a manufacturing process of the power semiconductor device according to the first embodiment.

In the sense well 41 that configures the MOSFET1, an n-type sense source region 81 is formed at two positions of the surface by ion injection. In other sense wells 41, except a part of wells, an n-type capacitor lower electrode region 82 is formed at two positions of the surface by ion injection (FIG. 4). Although not shown, an n-type main-cell source region is similarly formed at two positions of the surface of the main cell well.

By the above process, a first channel region is formed on the main-cell well surface between the main-cell source region and the drift layer 21, and a second channel region is formed on the surface of the sense well 41 between the sense source region 81 and the drift layer.

For the n-type impurity that is ion-injected into the sense source region 81, the capacitor lower electrode region 82, and the main-cell source region, N (nitrogen) or P (phosphor) is preferable. The impurity concentration is set higher than a p-type impurity concentration of the main cell well and the sense well 41, and also within a range of $1\times10^{17}$ cm$^{-3}$ to $1\times10^{21}$ cm$^{-3}$. Further, an injection depth is set such that the bottom surface does not exceed the bottom surfaces of main cell well and the sense well 41.

Figure 5:
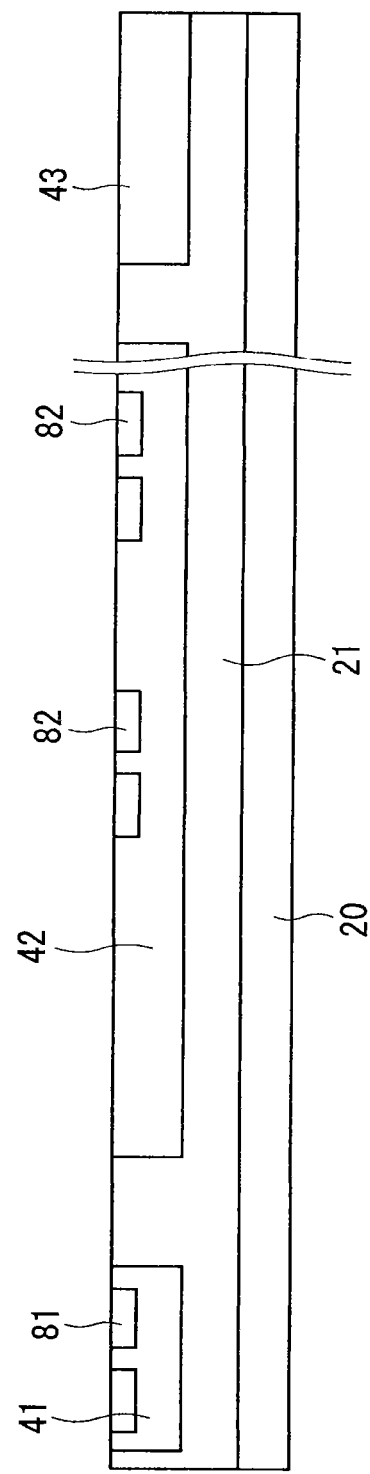
FIG. 5 is a cross-sectional view showing the manufacturing process of the power semiconductor device according to the first embodiment.

Next, by injecting a p-type ion into between a plurality of the sense wells 41 in which the n-type sense source region 81 is not formed, the sense outer-peripheral well 42 is formed by connecting these sense wells 41 (FIG. 5). The sense outer-peripheral well 42 can be formed simultaneously with the formation of the sense well 41 that configures the MOSFET1. By doing so, the number of processes does not increase.

Figure 6:
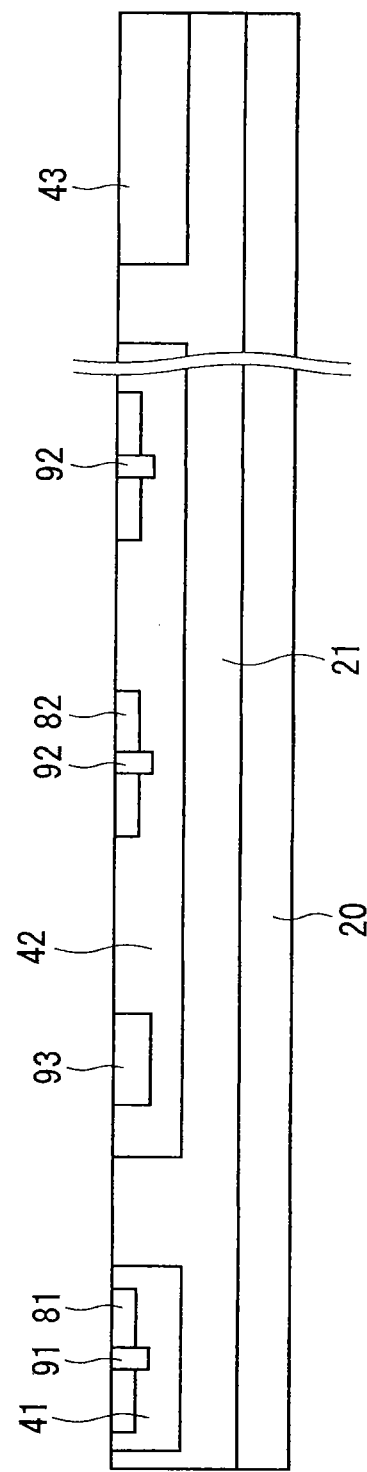
FIG. 6 is a cross-sectional view showing the manufacturing process of the power semiconductor device according to the first embodiment.

Further, by injecting a p-type ion, contact regions 91, 92, and 93 are formed (FIG. 6). The contact region 91 is formed between the sense source regions 81, and the contact region 92 is formed between capacitor lower electrode regions 82. The contact region 93 is selectively formed on the surface of a periphery (outer periphery) of a sense outer-peripheral well 42, and on the surface at a near side (inner periphery of the sense outer-peripheral well 42) of the sense well 41.

Preferably, p-type impurity concentrations of the contact regions 91, 92, and 93 are set higher than p-type impurity concentrations of the sense well 41 and the sense outer-peripheral well 42 in which the contact regions 91, 92, and 93 are formed. The semiconductor substrate 20 is heated to 150° C. or higher to perform ion injection, and thus the contact regions 91, 92, and 93 can be set to have low resistance.

Next, in an inert gas atmosphere of argon (Ar) gas or nitrogen gas, or in vacuum, annealing is performed in a temperature range of 1500° C. to 2200° C. and in a time range of 30 seconds to 60 minutes. Accordingly, the ion-injected impurity is electrically activated. The semiconductor substrate 20 or a film formed on this may be annealed in a state being covered with a carbon film. By performing annealing by covering with the carbon film, generation of surface coarseness of the silicon carbide generated by residual moisture and residual oxygen in the device in annealing can be prevented.

Then, an altered layer generated on the surface of the drift layer 21 in the ion injection process up to this time is removed. Specifically, a thermal oxide film is formed by performing sacrificial oxidization to the surface of the drift layer 21. By removing the thermal oxide film by hydrofluoric acid, the surface-altered layer of the drift layer 21 is removed to expose a clean surface.

Figure 7:
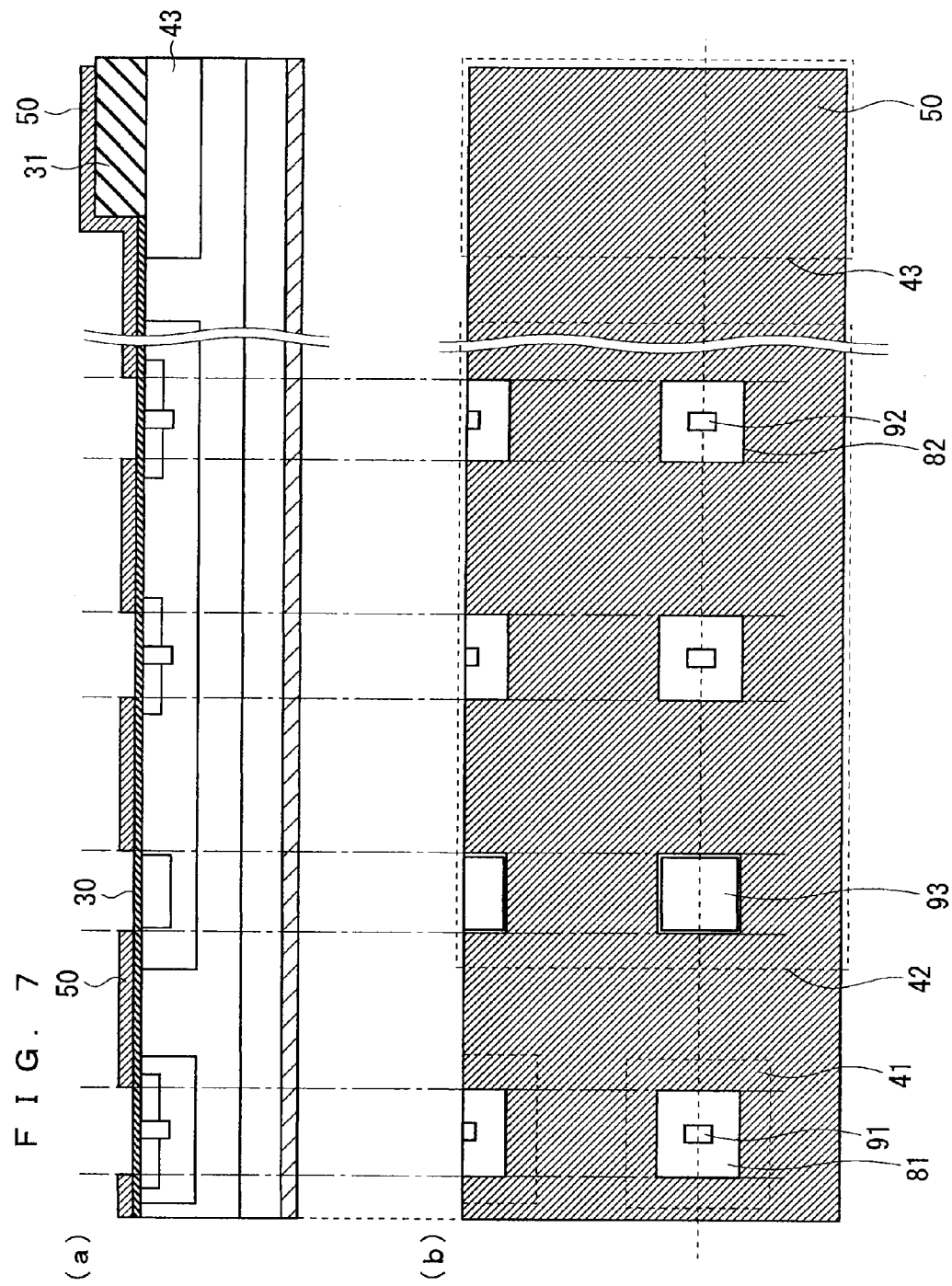
FIG. 7 is a cross-sectional view showing the manufacturing process of the power semiconductor device according to the first embodiment.

Next, a silicon dioxide film having a film thickness of about 0.5 μm to 2 μm called a field insulation film 31 is formed on the sense pad well 43, by a CVD method, a photolithographic technique, or the like a portion (a) of FIG. 7). For example, after forming the field insulation film 31 on a whole surface of the substrate, the field insulation film 31 formed on the surface other than the sense pad well 43 is removed by photolithography, etching, or the like. Consequently, the field insulation film 31 can be formed on only the sense pad well 43.

Further, the gate insulation film 30 thinner than the field insulation film 31 is formed at a position where the field insulation film 31 is not formed, such as on the main cell well, on the sense well 41, and on the sense outer-peripheral well 42. The gate insulation film 30 is a silicon dioxide film formed by using a thermal oxidation method or a deposition method. A thickness of the gate insulation film is about 1/10 of that of the field insulation film 31, preferably equal to or larger than 30 nm and equal to or smaller than 300 nm, and more preferably equal to or larger than 50 nm and equal to or smaller than 150 nm. The value of the film thickness depends on a gate voltage and a gate field with which and in which a MOSFET is driven (switching operation). Preferably, a gate field (electric field to be applied to the gate insulation film 30) is equal to or lower than 3 MV/cm.

Next, the gate electrode 50 of a polycrystal silicon material is formed by using the CVD method or the photolithographic technique, at a predetermined position on the gate insulation film 30 and the field insulation film 31. Preferably, the polycrystal silicon used for the gate electrode 50 includes P and B and has low resistance. P and B may be introduced during film formation of polycrystal silicon, or may be introduced by ion injection or the like after film formation. As a result, a configuration shown in a cross-sectional view of the portion (a) of FIG. 7 and a plan view of a portion (b) of FIG. 7 is formed.

Figure 8:
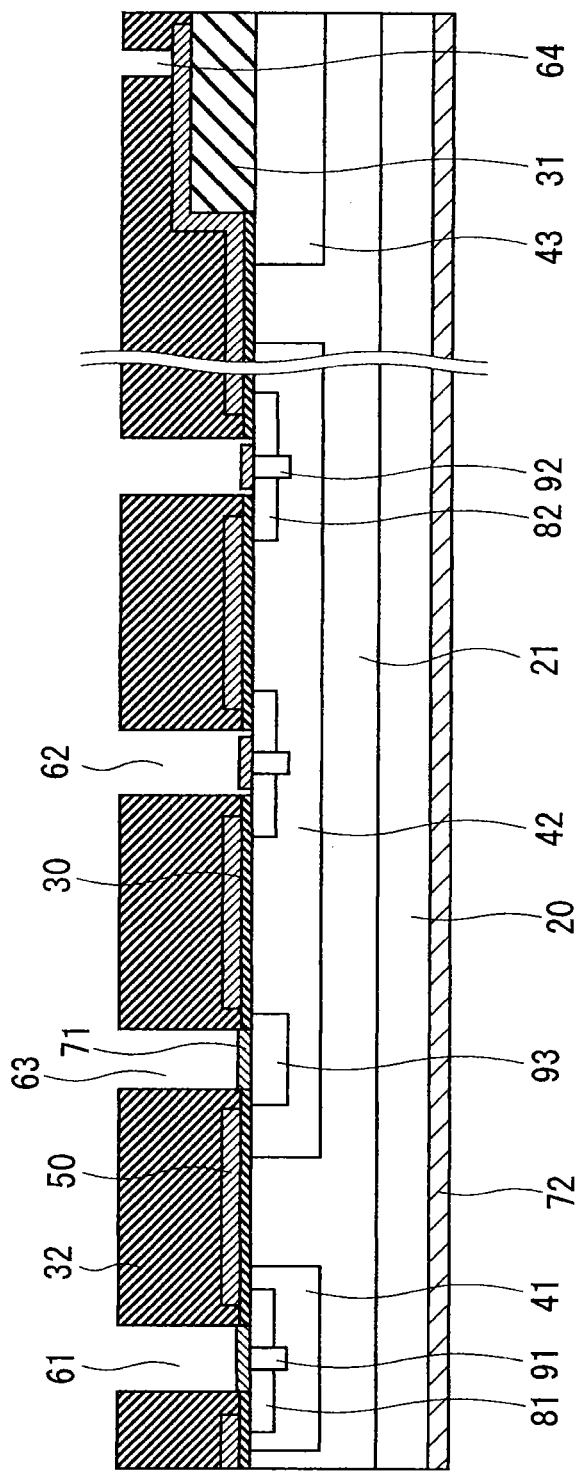
FIG. 8 is a cross-sectional view showing the manufacturing process of the power semiconductor device according to the first embodiment.

Then, on the gate electrode 50 and the gate insulation film 30, there is formed the interlayer insulation film 32 by using a deposition method such as the CVD method (FIG. 8). The interlayer insulation film 32 is a silicon dioxide film, for example. After forming the interlayer insulation film 32 on a whole surface, the sense contact hole 61 is formed by removing the, interlayer insulation film 32 on the sense source region 81 of the sense cell 1, by using the photolithographic technique or the dry etching technique. The capacitor contact hole 62 is formed by removing the interlayer insulation film 32 on the capacitor lower electrode region 82. The outer-peripheral well contact hole 63 is formed by removing the interlayer insulation film 32 on the contact region 93. Similarly, a contact hole (not shown) is formed by removing the interlayer insulation film 32 on the main-cell source region. In this case, the manufacturing process may be simplified by simultaneously forming the gate contact hole 64 described later.

Next, a metal film having Ni as a main component is formed by a sputtering method or the like. Then, the heat treatment is performed at a temperature of 600° C. to 1100° C., and a metal film having Ni as a main component and a silicon carbide layer are reacted, to form silicide between the silicon carbide layer and the metal film. A metal film that remains on the interlayer insulation film 32 other than the silicide generated by reaction is removed by wet etching or the like by using any one of sulfuric acid, nitric acid, and hydrochloric acid, or using a mixed solution of these and a hydrogen peroxide solution.

In this manner, the silicide formed in a contact hole (not shown) of a main cell source and the contact holes 61 to 63 becomes the ohmic electrode 71 shown in FIG. 3, and is in ohmic contact with both the n-type silicon carbide region such as the sense source region 81 and the p-type silicon carbide region such as the sense well 41.

Further, the interlayer insulation film 32 at a position that becomes the gate contact hole 64 is removed by using the photolithographic technique or the dry etching technique.

Next, a metal having Ni as a main component is formed on a rear surface of the semiconductor substrate 20, and the metal is heat treated, so that the rear-surface ohmic electrode 72 is formed on the rear side of the semiconductor substrate 20. The rear-surface ohmic electrode 72 and the ohmic electrode 71 may be formed by a simultaneous annealing process. A material of a compound of metals of the ohmic electrode 71 may be changed depending on each contact hole, or may be the same.

Thereafter, a wiring metal such as Al is formed by the sputtering method or the deposition method on the surface of the semiconductor substrate 20 that is so far processed. A formed resultant is processed in a predetermined shape by the photolithographic technique. As a result, the source pad 10, the gate pad 11, the gate wiring 12, and the sense pad 13 are formed.

The drain electrode 14 is formed by forming a metal film on the surface of the rear-surface ohmic electrode 72 of the rear surface of the substrate. In this way, the power semiconductor device which is shown in the cross-sectional view of FIG. 3 can be manufactured.

<Operation>

Figure 9:
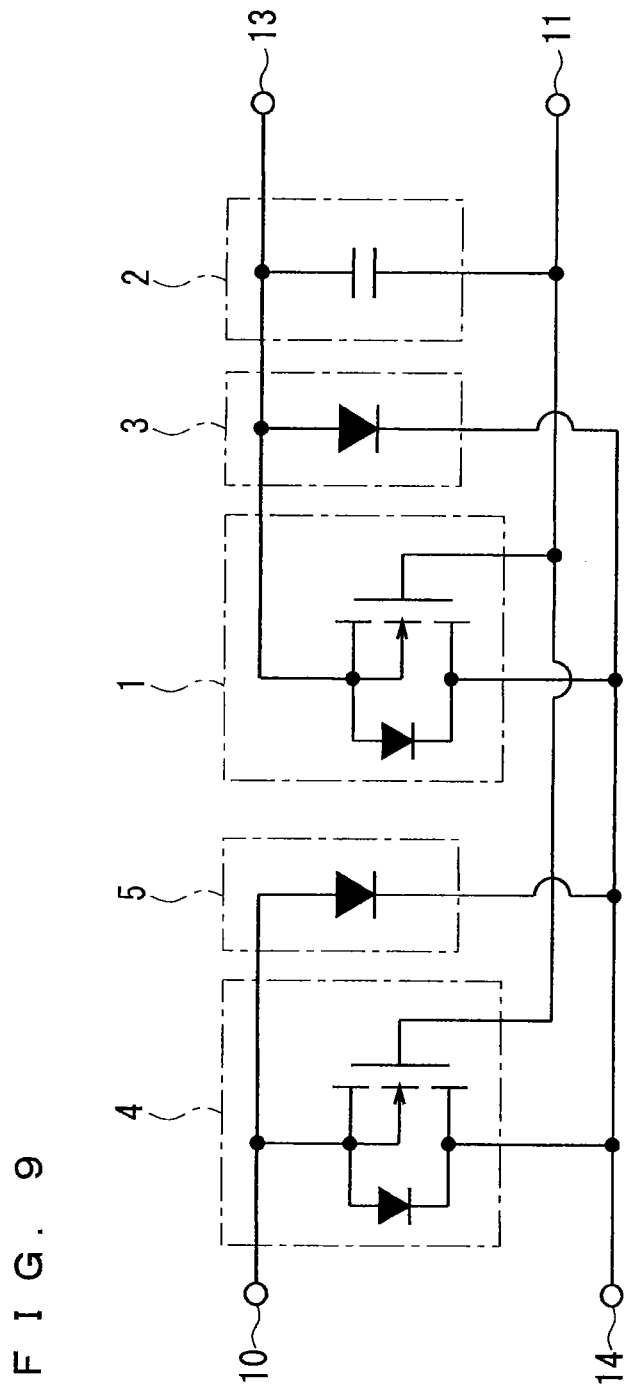
FIG. 9 is an equivalent circuit diagram of the power semiconductor device according to the first embodiment.

Next, a configuration of the power semiconductor device according to the present embodiment is described in an electric circuit. FIG. 9 is an equivalent circuit diagram of the power semiconductor device according to the first embodiment. As described in FIG. 2, the MOSFET1 is connected to the sense pad 13, the capacitor 2 is connected to between the sense pad 13 and the gate pad 11, and the pn diode 3 is connected to between the sense pad 13 and the drain electrode 14.

On the other hand, the MOSFET of the main cell is connected to the source pad 10, and the pn diode 5 formed by the sense pad well 43 and the drift layer 21 is connected to between the source pad 10 and the drain electrode 14.

Next, an operation of a case when static electricity is applied to between the gate pad 11 (gate wiring 12) and the sense pad 13 in the power semiconductor device according to the present embodiment is described with reference to the cross-sectional view of FIG. 3. When static electricity at a +side (Machine Model as one of indexes of static electricity resistance, for example) is applied to the gate pad 11, an inversion layer of electrons is formed in a channel region beneath the gate electrode 50, in the MOSFET1 of the sense cell. At the same time, an inversion layer of electrons is also formed in the sense outer-peripheral well 42 beneath the gate insulation film 30 of the capacitor 2. Both the MOSFET1 and the capacitor 2 have the same configurations except the p-type well. Therefore, input resistances on the silicon carbide semiconductor side have substantially the same values at a static electricity application time, that is, when observed in AC. Therefore, potential increases of gate electrodes of each cell of the MOSFET1 and the capacitor 2 become about the same.

For example, in a silicon carbide MOSFET, a large number of main cells, about a hundred thousand main cells are configured, and about 20 sense cells are provided to be connected to the sense pad 13. Transistor capacitance of a sense cell is set to 2 pF. In the present embodiment, inactive MOSFET cells are arranged at a periphery of the sense cells, and are connected to the sense pad 13. When 1000 inactive MOSFET cells are arranged, the transistor capacitance becomes 100 pF. In this way, by setting the input capacitance of the capacitor 2 to ten times to 1000 times (two times in FIG. 2) of the input capacitance of the MOSFET1 (sense cell) by adjusting the number of cells of an inactive MOSFET that configures the capacitor 2, a gate field can be set to 5 MV/cm or lower even when static electricity is applied. Consequently, destruction of the gate insulation film 30 can be suppressed.

When static electricity of a – (minus) side is applied to the gate pad, an accumulation layer of holes is formed on the surface of the MOSFET1 of the sense cell, and also an accumulation layer of holes is also formed beneath the gate insulation film of the capacitor 2. Similar to the case of static electricity at the +side, since the MOSFET1 and the capacitor 2 have similar structures, resistance values at the silicon carbide semiconductor side at the static electricity application time are substantially the same values. Therefore, potential increases of the MOSFET1 and the gate electrode 50 of the capacitor 2 are substantially the same. By setting the input capacitance of the capacitor 2 to ten times to 1000 times (two times in FIG. 2) of the input capacitance of the MOSFET1 by adjusting the number of cells that configure the capacitor 2, a gate field can be set to 5 MV/cm or lower, and destruction of the insulation film can be suppressed even when static electricity is applied.

By providing an inversion-type MOS capacitor 2 that includes the capacitor lower electrode region 82 as the n-type electron supply layer, response becomes possible to even high-speed surge.

Further, since the gate wiring 12 of the pn diode 3 works as a rush resistor to the MOSFET1, static electricity resistance can be secured.

In the present embodiment, although description is made by using the silicon carbide MOSFET, the present invention can be also applied to other power semiconductor device such as an IGBT.

<Effects>

The power semiconductor device according to the first embodiment includes the first conductive type semiconductor substrate 20, the first conductive type drift layer 21 formed on the first principal surface of the semiconductor substrate 20, the plurality of second conductive type main cell wells and the plurality of second conductive type sense wells 41 selectively formed on the surface of the drift layer 21, the second conductive type sense outer-peripheral well 42 formed to surround the plurality of sense wells 41 on the surface of the drift layer 21, the first conductive type main-cell source region selectively formed on the surface of the main cell well, the first channel region formed on the main-cell well surface between the main-cell source region and the drift layer 21, the first conductive type sense source region 81 selectively formed on the surface of the sense well 41, the second channel region formed on the surface of the sense well 41 between the sense source region 81 and the drift layer 21, the first conductive type capacitor lower electrode region 82 selectively formed on the surface of the sense outer-peripheral well 42, the gate insulation film 30 formed on the first and second channel regions and on the sense outer-peripheral well 42, the gate electrode 50 formed on the gate insulation film 30, the source pad 10 electrically connected to the main cell well and the main-cell source region, the sense pad 13 electrically connected to the sense well 41, the sense source region 81, and the sense outer-peripheral well 42 and the capacitor lower electrode region 82, and the drain electrode 14 formed on the second principal surface of the semiconductor substrate 20. The sense outer-peripheral well 42, the capacitor lower electrode region 82, the gate insulation film 30, and the gate electrode 50 operate as the capacitor 2 having low input resistance observed in AC. Therefore, by increasing the capacitance of the capacitor 2 by adjusting the number of cells, the electric field of the gate insulation film 30 when static electricity is applied can be mitigated, and dielectric breakdown can be suppressed.

Particularly, in the power semiconductor device according to the first embodiment, the semiconductor substrate 20 is a semiconductor substrate that uses a wide band gap semiconductor represented by silicon carbide. Conductivity or a resistance value of a conventional semiconductor device, that is, a p-type barrier layer itself adopted by a silicon semiconductor is lower than that of a silicon carbide semiconductor by about one digit. Therefore, in the silicon carbide semiconductor, in the case of constituting a capacitor by a thin gate insulation film sandwiched between the gate electrode and the p-type barrier layer, the input resistance value observed in AC becomes high.

Further, the power semiconductor device according to the first embodiment further includes a plurality of second conductive type contact regions 93 selectively formed on the surface, the outer periphery and the inner periphery of the sense outer-peripheral well 42 and electrically connected to the sense pad 13. The capacitor lower electrode region 82 is formed in a region surrounded by the plurality of contact regions 93. By such a configuration, cells configured by the capacitor lower electrode region 82 become inactive, and operate as only the capacitor 2.

(Second Embodiment)

Figure 10:
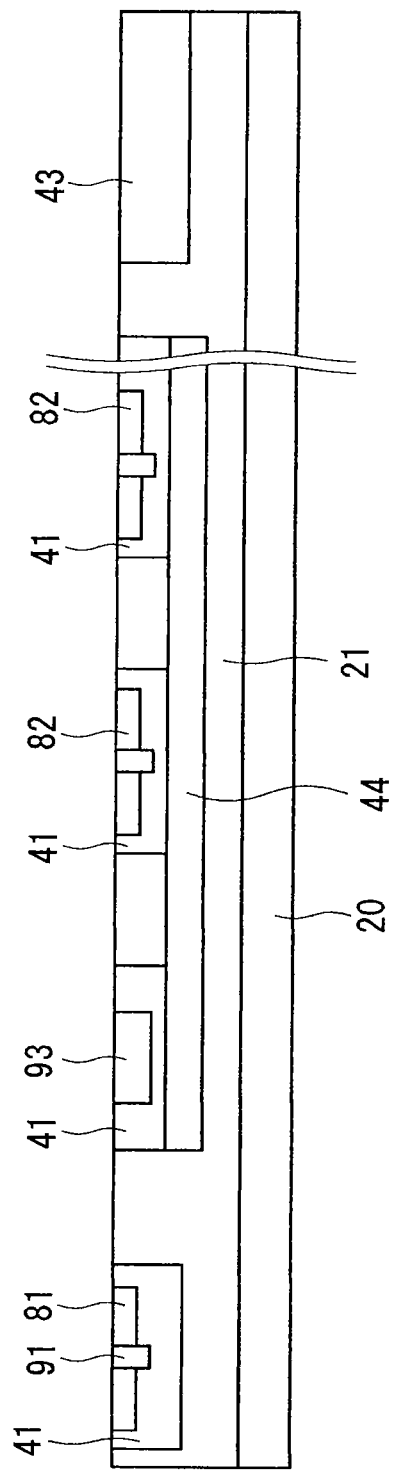
FIG. 10 is a cross-sectional view showing a manufacturing process of a power semiconductor device according to a second embodiment.

FIG. 10 is a cross-sectional view showing a configuration of a power semiconductor device according to a second embodiment.

In the power semiconductor device according to the first embodiment, in the process shown in FIG. 5 for forming the sense outer-peripheral well 42 by connecting the plurality of sense wells 41, each sense well 41 is connected on all cross-sections from the surface to the bottom part of the sense well 41. On the other hand, in the power semiconductor device according to the second embodiment, each sense well 41 is connected, by a sense outer-peripheral well 44 formed to be in contact with the bottom part of each sense well 41, with leaving each sense well 41 to be connected as an island shape.

FIG. 10 is a cross-sectional view showing a manufacturing process of the power semiconductor device according to the second embodiment corresponding to FIG. 5. The n-type drift layer 21 is present between the sense wells 41. That is, the well provided to surround the sense well 41 is formed as a two-layer structure of the sense outer-peripheral well 44 (first sense outer-peripheral well) continuously formed in a region of a predetermined depth from the surface of the drift layer 21, and the sense well 41 (second sense outer-peripheral well) formed in an island shape corresponding to the contact region 93 and the capacitor lower electrode region 82 from the sense outer-peripheral well 44 to the surface of the drift layer 21.

Figure 11:
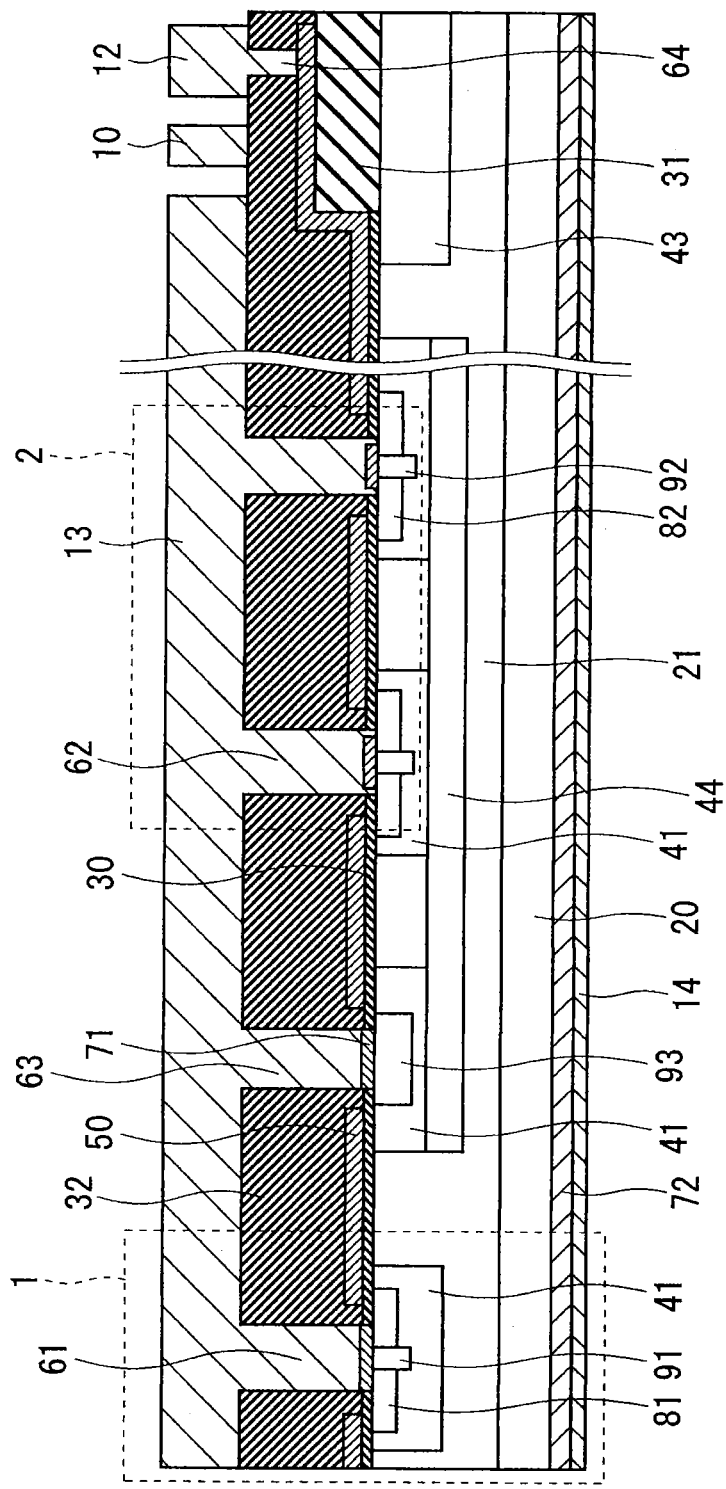
FIG. 11 is a cross-sectional view of the power semiconductor device according to the second embodiment.

FIG. 11 is a cross-sectional view of the power semiconductor device according to the second embodiment. According to the configuration shown in FIG. 11, the capacitor 2 and the MOSFET1 have the same structures from a boundary in a depth direction between the drift layer 21 and the sense outer-peripheral well 44 to below the gate insulation film. Therefore, input capacitance values and input resistance values for each cell of the capacitor 2 and the MOSFET1 become extremely the same value. Therefore, when static electricity is applied to the gate electrode 50, potential increases of the MOSFET1 and the gate electrode 50 of the capacitor 6 become the same. Consequently, by adjusting the capacitance of the capacitor 2, the gate field can be suppressed to 5 MV/cm or below, and destruction of the gate insulation film 30 can be suppressed.

<Effects>

In the power semiconductor device according to the second embodiment, the sense outer-peripheral well that surrounds the sense well 41 constituting the MOSFET1 includes the sense outer-peripheral well 44 (first sense outer-peripheral well) continuously formed in the region having a predetermined depth from the surface of the drift layer 21, and the sense well 41 (second sense outer-peripheral well) formed in an island shape corresponding to the contact region 93 and the capacitor lower electrode region 82 from the sense outer-peripheral well 44 to the surface of the drift layer 21. Consequently, the capacitor 2 and the MOSFET1 have the same structures from the boundary in a depth direction between the drift layer 21 and the sense outer-peripheral well 44 to below the gate insulation film. Therefore, when static electricity is applied to the gate electrode 50, potential increases of the MOSFET1 and the gate electrode 50 of the capacitor 6 become the same. Consequently, by adjusting the capacitance of the capacitor 2, the gate field can be mitigated, and destruction of the gate insulation film 30 can be suppressed.

(Third Embodiment)

In the power semiconductor device according to the first embodiment, the plurality of capacitor lower electrode region 82 is formed. In a power semiconductor device according to a third embodiment, the number of contact with the sense pad 13 is left as it is, and a continuous capacitor lower electrode region 83 by connecting all plurality of capacitor lower electrode regions 82 are formed.

Figure 12:
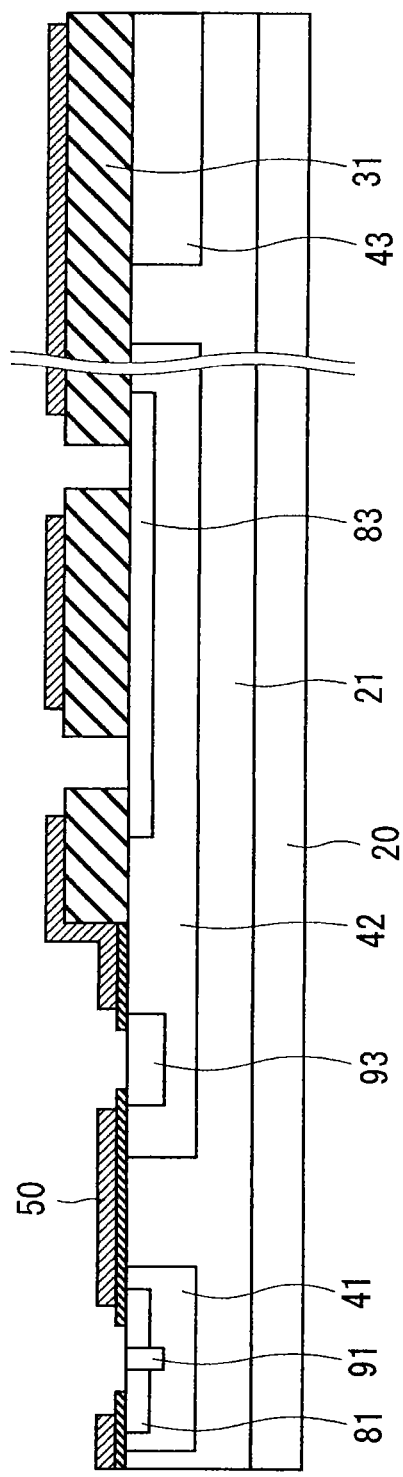
FIG. 12 is a cross-sectional view showing a manufacturing process of an power semiconductor device according to a third embodiment.

FIG. 12 is a cross-sectional view showing a manufacturing process of the power semiconductor device according to the third embodiment. After selectively forming the sense outer-peripheral well 42 on the surface of the drift layer 21, a continuous capacitor lower electrode region 83 is selectively formed on the surface of the sense outer-peripheral well 42. Alternatively, after selectively forming a plurality of sense wells 41 on the surface of the drift layer 21, the capacitor lower electrode region 82 is selectively formed on the surface of each sense well 41 (similar to FIG. 4), and the plurality of sense wells 41 are connected to form the sense outer-peripheral well 42 (similar to FIG. 5). Thereafter, the capacitor lower electrode region 83 may be formed by connecting the capacitor lower electrode region 82.

Thereafter, the field insulation film 31 thicker than the gate insulation film 30 is formed on the capacitor lower electrode region 83, and the gate electrode 50 is formed on this upper layer. The Configuration is similar to that of the power semiconductor device according to the first embodiment except the capacitor lower electrode region 83 and the field insulation film 31, and therefore the description is omitted.

Figure 13:
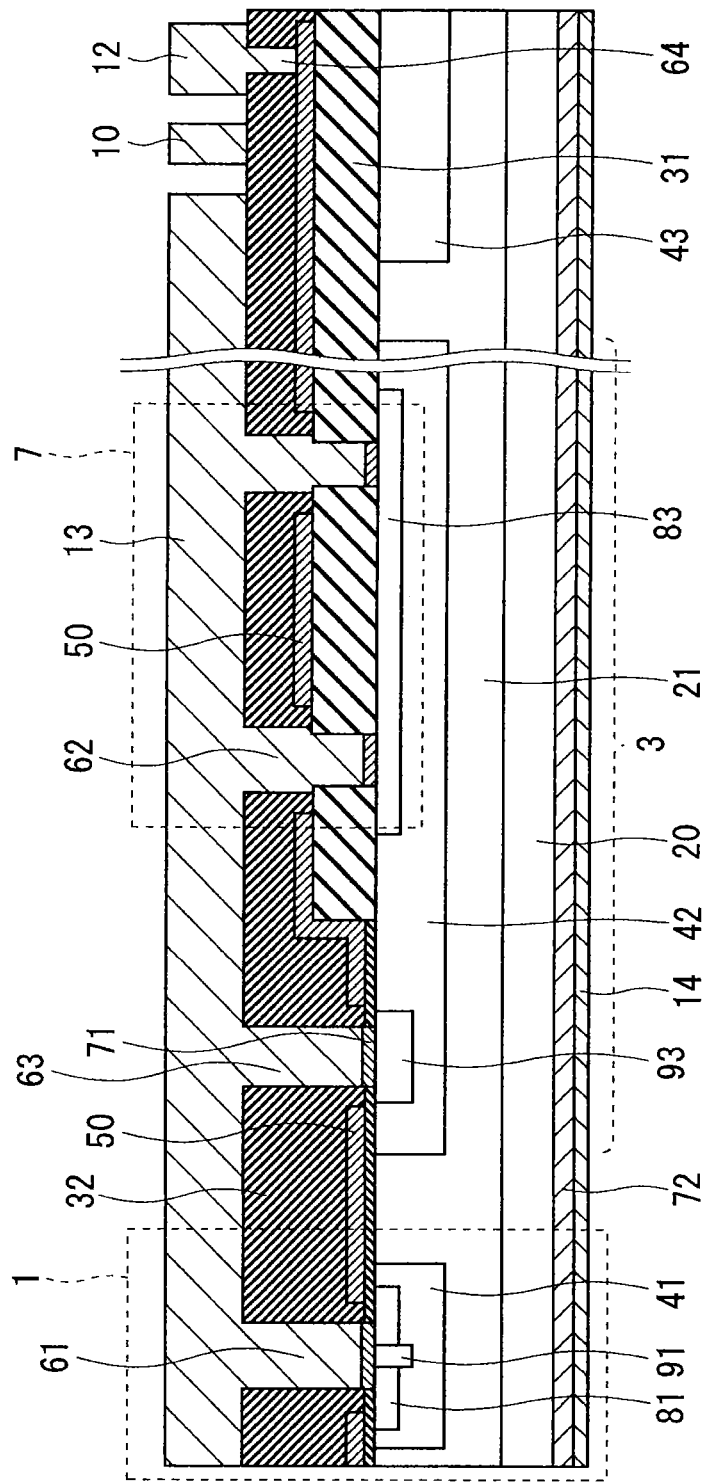
FIG. 13 is a cross-sectional view of the power semiconductor device according to the third embodiment.

FIG. 13 is a cross-sectional view of the power semiconductor device according to the third embodiment. The sense outer-peripheral well 42, the capacitor lower electrode region 83, the field insulation film 31, and the gate electrode 50 operate as a capacitor 7. Since the capacitor lower electrode region 83 corresponding to the lower electrode of the capacitor 7 has a high n-type impurity concentration of $1 \times 10^{17}$ cm$^{-3}$ to $1 \times 10^{21}$ cm$^{-3}$, an input resistance value of the capacitor 7 between the gate electrode 50 and the sense pad 13 becomes an extremely low value observed in AC. Therefore, even when static electricity is applied to the gate electrode 50, potential increase of the gate electrode of the MOSFET1 can be suppressed, and destruction of the gate insulation film 30 in the MOSFET1 can be suppressed.

<Effects>

The power semiconductor device according to the third embodiment further includes the field insulation film 31 thicker than the gate insulation film 30, selectively formed on the capacitor lower electrode region 83, and the gate electrode 50 is also formed on the field insulation film 31. Therefore, the input resistance value of the capacitor 7 configured by the gate electrode 50, the field insulation film 31, the capacitor lower electrode region 83, and the sense outer-peripheral well 42 becomes an extremely low value. Therefore, the electric field applied to the gate insulation film 30 of the MOSFET1 when static electricity is applied to the gate electrode 50 can be mitigated, and dielectric breakdown can be suppressed.

Explanation of Reference Numerals

1 Sense cell, 2 Capacitor, 3, 5 pn diode, 4 Main cell, 10 Source pad, 11 Gate pad, 12 Gate wiring, 13 Sense pad, 14 Drain electrode, 20 Substrate, 21 Drift layer, 30 Gate insulation film, 31 Field insulation film, 32 Interlayer insulation film, 41 Sense well, 42, 44 Sense outer-peripheral well, 43 Sense pad well 50 Gate electrode, 61 Sense contact hole, 62 Capacitor contact hole, 63 Outer-peripheral well contact hole, 64 Gate contact hole, 71 Ohmic electrode, 72 Rear-surface ohmic electrode, 81 Sense source region, 82, 83 Capacitor lower electrode region, 91, 92, 93 Contact region.

The invention claimed is:

1. A power semiconductor device comprising:
a first conductive type drift layer formed on a first principal surface of a first conductive type silicon carbide semiconductor substrate;
a plurality of second conductive type main cell wells and a plurality of second conductive type sense wells selectively formed on a surface of the drift layer;
a second conductive type sense outer-peripheral well formed to surround the plurality of wells on the surface of the drift layer;
a first conductive type main-cell source region selectively formed on the surface of the main cell well;
a first channel region formed on the surface of the main cell well between the main-cell source region and the drift layer;
a first conductive type sense source region selectively formed on the surface of the sense well;
a second channel region formed on the surface of the sense well between the sense source region and the drift layer;
a plurality of second conductive type contact regions selectively formed on a surface as well as an outer periphery and an inner periphery of the sense outer-peripheral well and electrically connected to the sense pad,
a first conductive type capacitor lower electrode region selectively formed in a region surrounded by the surface as well as the outer periphery and the inner periphery of the sense outer-peripheral well;
a gate insulation film formed on the first and second channel regions and on the sense outer-peripheral well;
a gate electrode formed on the gate insulation film;
a source pad electrically connected to the main cell well and the main-cell source region;
a sense pad electrically connected to the sense well and the sense source region as well as the sense outer-peripheral well and the capacitor lower electrode region; and
a drain electrode formed on a second principal surface of the semiconductor substrate.

2. The power semiconductor device according to claim 1, further comprising:
a MOSFET configured by the sense well, the sense source region, a second channel region, and a gate electrode; and
a capacitor configured by the sense outer-peripheral well, the capacitor lower electrode region, and the gate electrode, wherein the MOSFET and the capacitor have same configurations other than the sense well and the sense outer-peripheral well.

3. The power semiconductor device according to claim 1, wherein the sense well and the sense outer-peripheral well are simultaneously formed.

4. The power semiconductor device according to claim 1, wherein the sense outer-peripheral well comprises:
   a first sense outer-peripheral well continuously formed in a region having a predetermined depth from a surface of the drift layer; and
   a second sense outer-peripheral well having a same shape as the sense well formed in an island shape corresponding to the contact region and the capacitor lower electrode region from the first sense outer-peripheral well to the surface of the drift layer.

* * * * *